(12) United States Patent
Mizuno et al.

(10) Patent No.: US 10,879,035 B2
(45) Date of Patent: Dec. 29, 2020

(54) SCANNING ELECTRON MICROSCOPE AND MEASUREMENT METHOD FOR OBTAINING IMAGES OF A SPECIMEN USING AN ION BEAM AND AN ELECTRON BEAM

(71) Applicant: JEOL Ltd., Tokyo (JP)

(72) Inventors: Noriaki Mizuno, Tokyo (JP); Toshikatsu Kaneyama, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/254,965

(22) Filed: Jan. 23, 2019

(65) Prior Publication Data

US 2019/0228948 A1  Jul. 25, 2019

(30) Foreign Application Priority Data

Jan. 24, 2018 (JP) .................................. 2018-009998

(51) Int. Cl.

| | |
|---|---|
| *H01J 37/22* | (2006.01) |
| *H01J 37/31* | (2006.01) |
| *H01J 37/28* | (2006.01) |
| *H01J 37/305* | (2006.01) |
| *G01N 1/28* | (2006.01) |

(52) U.S. Cl.
CPC ............ *H01J 37/222* (2013.01); *H01J 37/28* (2013.01); *H01J 37/3056* (2013.01); *H01J 37/31* (2013.01); *G01N 2001/2873* (2013.01); *H01J 2237/24475* (2013.01); *H01J 2237/24485* (2013.01); *H01J 2237/2804* (2013.01); *H01J 2237/2807* (2013.01)

(58) Field of Classification Search
None
See application file for complete search history.

(56) References Cited

U.S. PATENT DOCUMENTS

| | | | | |
|---|---|---|---|---|
| 2011/0064191 | A1* | 3/2011 | Toth ................ | G01N 23/20033 378/53 |
| 2015/0060664 | A1* | 3/2015 | Man ................ | G01N 23/20091 250/307 |

(Continued)

FOREIGN PATENT DOCUMENTS

JP           201550126 A         3/2015

OTHER PUBLICATIONS

Extended European Search Report issued in EP19153033.6 dated Jun. 24, 2019.

*Primary Examiner* — James Choi
(74) *Attorney, Agent, or Firm* — The Webb Law Firm

(57) ABSTRACT

A scanning electron microscope includes an FIB column, an SEM column, and a control unit which controls the FIB column and the SEM column. The control unit performs: processing to control the FIB column so that a cross-section of a specimen S is repeatedly exposed at predetermined intervals; processing to perform a first measurement to acquire a first image by irradiating a cross-section of the specimen S with an electron beam each time when a cross-section of the specimen S is exposed; and processing to perform a second measurement to acquire a second image by irradiating a cross-section of the specimen S with an electron beam each time when a cross-section of the specimen S is exposed n times (n is an integer of 2 or more).

9 Claims, 8 Drawing Sheets

(56) References Cited

U.S. PATENT DOCUMENTS

| | | | |
|---|---|---|---|
| 2015/0115156 A1* | 4/2015 | Suzuki | H01J 37/3056 |
| | | | 250/307 |
| 2016/0181061 A1* | 6/2016 | Kim | H01J 37/222 |
| | | | 250/307 |
| 2016/0343541 A1 | 11/2016 | Man et al. | |
| 2016/0353541 A1 | 12/2016 | Ondrisek et al. | |

* cited by examiner

SCANNING ELECTRON MICROSCOPE AND MEASUREMENT METHOD FOR OBTAINING IMAGES OF A SPECIMEN USING AN ION BEAM AND AN ELECTRON BEAM

CROSS-REFERENCE TO RELATED APPLICATION

This application claims priority to Japanese Patent Application No. 2018-009998 filed Jan. 24, 2018, the disclosure of which is hereby incorporated by reference in its entirety.

BACKGROUND OF THE INVENTION

The present invention relates to a scanning electron microscope and a measurement method.

In recent years, a scanning electron microscope (SEM), which includes a focused ion beam (FIB) device, is attracting attention.

For example, JP-A-2015-50126 discloses a method of observing a plurality of tomographic images of a specimen using a scanning electron microscope which includes a focused ion beam system. In this observation method, a cross-section exposing step of irradiating the specimen with a focused ion beam so as to expose a cross-section of the specimen; and a tomographic image acquiring step of irradiating a cross-section of the specimen with an electron beam and acquiring the tomographic image of the specimen, are repeatedly performed along a predetermined direction of the specimen at predetermined intervals. From the acquired plurality of tomographic images, a three-dimensional image of the specimen can be constructed.

In JP-A-2015-50126, an SEM image is acquired on a cross-section of a specimen, but an energy dispersive X-ray spectrometry (EDS) mapping image may be acquired in addition to the SEM image. Then a three-dimensional image can be constructed by using the acquired plurality of EDS mapping data.

However, the measurement to acquire the EDS mapping data consumes time compared with the measurement to acquire the SEM image. Therefore, measurement must be performed for a long period of time in order to acquire a plurality of EDS mapping images in addition to a plurality of SEM images.

SUMMARY OF THE INVENTION

According to a first aspect of the invention, there is provided a scanning electron microscope including:

an ion beam column that irradiates a specimen with an ion beam;

an electron beam column that irradiates the specimen with an electron beam;

a first detector that detects a first signal from the specimen;

a first image generation unit that generates a first image based on a detection signal from the first detector;

a second detector that detects a second signal from the specimen;

a second image generation unit that generates a second image based on a detection signal from the second detector; and a control unit that controls the ion beam column and the electron beam column, the control unit performing:

processing to control the ion beam column to cause cross-sections of the specimen to be exposed at predetermined intervals;

processing to perform a first measurement to acquire the first image by irradiating a cross-section of the specimen with an electron beam each time when a cross-section of the specimen is exposed; and processing to perform a second measurement to acquire the second image by irradiating a cross-section of the specimen with an electron beam each time when a cross-section of the specimen is exposed n times (n is an integer of 2 or more), wherein a spatial resolution of the first measurement is higher than a spatial resolution of the second measurement.

According to a second aspect of the invention, there is provided a measurement method including:

exposing cross-section of a specimen at predetermined intervals;

performing a first measurement to acquire a first image by irradiating a cross-section of the specimen with an electron beam each time when a cross-section of the specimen is exposed; and performing a second measurement to acquire a second image by irradiating a cross-section of the specimen with an electron beam each time when a cross-section of the specimen is exposed n times (n is an integer of 2 or more), wherein a spatial resolution of the first measurement is higher than a spatial resolution of the second measurement.

DESCRIPTION OF THE INVENTION

Figure 1:
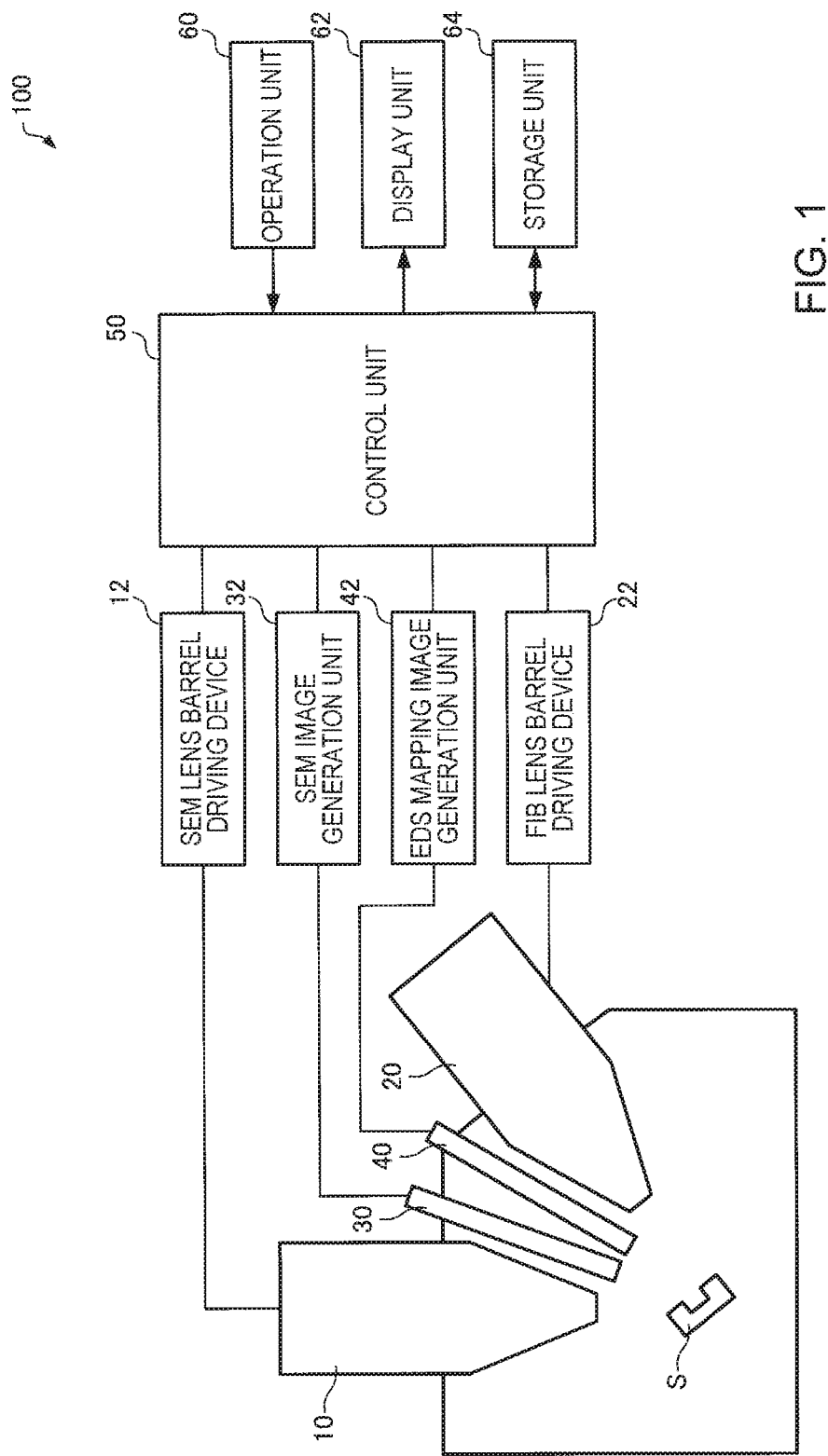
FIG. 1 is a diagram illustrating a configuration of a scanning electron microscope according to an embodiment of the invention.

According to an embodiment of the invention, there is provided a scanning electron microscope including:

an ion beam column that irradiates a specimen with an ion beam;

an electron beam column that irradiates the specimen with an electron beam;

a first detector that detects a first signal from the specimen;

a first image generation unit that generates a first image based on a detection signal from the first detector;

a second detector that detects a second signal from the specimen;

a second image generation unit that generates a second image based on a detection signal from the second detector; and a control unit that controls the ion beam column and the electron beam column, the control unit performing:

processing to control the ion beam column to cause cross-sections of the specimen to be exposed at predetermined intervals, processing to perform a first measurement to acquire the first image by irradiating a cross-section of the specimen with an electron beam each time when a cross-section of the specimen is exposed, and processing to perform a second measurement to acquire the second image by irradiating a cross-section of the specimen with an electron beam each time when a cross-section of the specimen is exposed n times (n is an integer of 2 or more), wherein a spatial resolution of the first measurement is higher than a spatial resolution of the second measurement.

According to this scanning electron microscope, the control unit executes the processing to perform the first measurement each time when the cross-section of the specimen is exposed, and the processing to perform the second measurement each time when the cross-section of the specimen is exposed n times. Therefore, with this scanning electron microscope, the measurement time can be reduced compared with the case of performing the second measurement each time when the cross-section of the specimen is exposed, for example.

According to an embodiment of the invention, there is provided a measurement method including:

exposing cross-sections of a specimen at predetermined intervals;

performing a first measurement to acquire a first image by irradiating a cross-section of the specimen with an electron beam each time when a cross-section of the specimen is exposed; and performing a second measurement to acquire a second image by irradiating a cross-section of the specimen with an electron beam each time when a cross-section of the specimen is exposed n times (n is an integer of 2 or more), wherein a spatial resolution of the first measurement being higher than a spatial resolution of the second measurement.

According to this measurement method, the step of performing the first measurement each time when the cross-section of the specimen is exposed and the step of performing the second measurement each time when the cross-section of the specimen is exposed n times are included. Therefore, the measurement time can be reduced compared with the case of performing the second measurement each time when the cross-section of the specimen is exposed, for example.

Embodiments of the invention are described in detail below with reference to the drawings. Note that the following embodiments do not unduly limit the scope of the invention as stated in the claims. In addition, all of the elements described in connection with the following embodiments should not necessarily be taken as essential requirements of the invention.

1. Electron Microscope

An electron microscope according to an embodiment of the invention will be described first with reference to the drawings. FIG. 1 is a diagram illustrating a configuration of a scanning electron microscope 100 according to an embodiment of the invention.

The scanning electron microscope 100 includes an SEM column 10, an SEM column driving device 12, an FIB column 20, an FIB column driving device 22, a secondary electron detector 30, an SEM image generation unit 32, an EDS detector 40, an EDS mapping image generation unit 42, a control unit 50, an operation unit 60, a display unit 62, and a storage unit 64.

The SEM column 10 is an optical system to form an electron beam and to perform scanning with the electron beam. The SEM column 10 includes an electron source (electron gun) which emits an electron beam, a lens system which focuses the electron beam, and a scanning coil to perform scanning with an electron beam. Operation of the SEM column 10 is controlled by the SEM column driving device 12.

The FIB column 20 is an optical system to form a focused ion beam and to perform scanning with the focused ion beam. The FIB column 20 includes an ion source (ion gun) which emits an ion beam, a lens system which focuses an ion beam, and a deflector which performs scanning with the focused ion beam. The operation of the FIB column 20 is controlled by the FIB column driving device 22.

The secondary electron detector 30 (an example of the first detector) detects a secondary electron (an example of the first signal) emitted from the specimen S which is irradiated with an electron beam.

The SEM image generation unit 32 (an example of the first image generation unit) generates an SEM image (an example of the first image) based on a detection signal outputted from the secondary electron detector 30. The SEM image generation unit 32 includes a frame memory which has a plurality of storage areas, for example. The SEM image generation unit 32 stores the detection signal from the secondary electron detector 30 in a storage area at an address which is specified based on a scanning signal. Thereby an SEM image (secondary electron image) can be acquired.

In the description here, it is assumed that the scanning electron microscope 100 includes the secondary electron detector 30, and acquires a secondary electron image as the SEM image, but the scanning electron microscope 100 may include a reflected-electron detector, and acquires a reflected-electron image as the SEM image, although this is not illustrated. The scanning electron microscope 100 may include both the secondary electron detector and the reflected-electron detector.

The EDS detector 40 (an example of the second detector) detects a characteristic X-ray (an example of the second signal) which is emitted from the specimen S which is irradiated with an electron beam.

The EDS mapping image generation unit 42 (an example of the second image generation unit) generates an EDS mapping image (an example of the second image) based on a detection signal outputted from the EDS detector 40. The EDS mapping image generation unit 42 specifies an irradiation position of the electron beam based on the scanning signal, for example, acquires an X-ray intensity of a specified element from the detection signal at this irradiation position, and generates the EDS mapping image of the specified element.

The functions of the SEM image generation unit 32 and the EDS mapping image generation unit 42 are implemented by various processors (e.g. central processing unit (CPU))

executing programs. The SEM image generation unit 32 and the EDS mapping image generation unit 42 may be included in the control unit 50.

The operation unit 60 acquires an operation signal in accordance with the operation by the user, and transmits the acquired operation signal to the control unit 50. The operation unit 60 is buttons, keys, a touch panel type display or a microphone, for example. By operating the operation unit 60, the user can input measurement conditions to acquire a plurality of SEM images (hereafter also called "SEM image series") to reconstruct a three-dimensional image, and measurement conditions to acquire a plurality of EDS mapping images (hereafter also called "EDS mapping image series") to reconstruct a three-dimensional image.

The display unit 62 displays an image generated by the control unit 50. The display unit 62 is implemented by such a display as a liquid crystal display (LCD).

The storage unit 64 stores programs and data for the control unit 50 to perform various calculation processing and control processing. The storage unit 64 is also used as a work area of the control unit 50, and is also used to temporarily store a result of a calculation which the control unit 50 executed in accordance with various programs. The storage unit 64 can be implemented by a random access memory (RAM), a read only memory (ROM), a hard disk and the like.

The control unit 50 performs various control processing and calculation processing in accordance with programs stored in the storage unit 64. The functions of the control unit 50 can be implemented by various processors (e.g. central processing unit (CPU)) executing programs.

The control unit 50 controls the SEM column 10, the FIB column 20, the secondary electron detector 30 and the EDS detector 40. The control unit 50 performs processing to acquire the SEM image series and the EDS mapping image series. In concrete terms, the control unit 50 performs processing to control the FIB column 20, so that a cross-section of the specimen S is repeatedly exposed at a predetermined interval, processing to perform a measurement to acquire a SEM image by irradiating a cross-section of the specimen S with an electron beam each time when the cross-section of the specimen is exposed (an example of the first measurement), and processing to perform a measurement to acquire an EDS mapping image by irradiating a cross-section of the specimen S with an electron beam each time when a cross-section of the specimen S is exposed n times (n is an integer of 2 or more) (an example of the second measurement). The processing of the control unit 50 will be described in detail in the following "2. Measurement Method".

2. Measurement Method

A measurement method according to an embodiment of the invention will be described next. In the following, a measurement method to acquire an SEM image series and an EDS mapping image series will be described.

The measurement method according to an embodiment of the invention includes: a step of repeatedly exposing a cross-section of a specimen S at an interval D; a step of performing a measurement to acquire an SEM image by irradiating a cross-section of the specimen S with an electron beam each time when a cross-section of the specimen S is exposed; and a step of performing a measurement to acquire an EDS mapping image by irradiating a cross-section of the specimen S with an electron beam each time when a cross-section of the specimen S is exposed n times (n is an integer of 2 or more).

Figure 2:
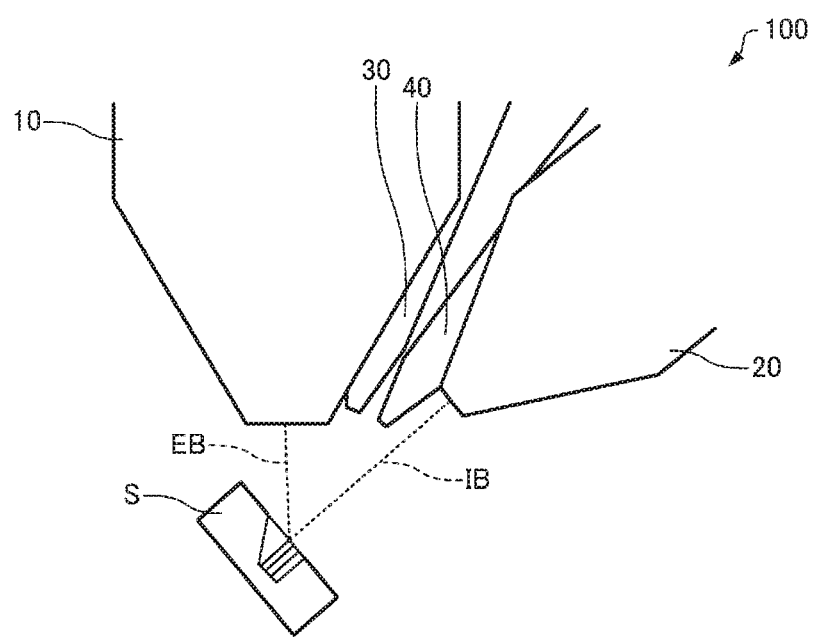
FIG. 2 is a schematic diagram illustrating a state of processing a cross-section of a specimen using a focused ion beam.
Figure 3:
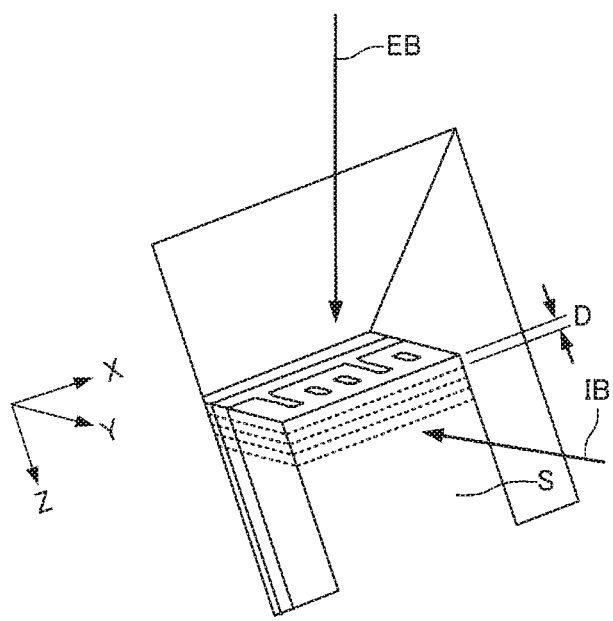
FIG. 3 is a schematic diagram illustrating a state of processing a cross-section of a specimen using a focused ion beam.

First the step of repeatedly exposing a cross-section of the specimen S will be described. FIG. 2 and FIG. 3 are schematic diagrams illustrating a state of processing a cross-section of the specimen S using the focused ion beam IB. In FIG. 3, the X axis, Y axis and Z axis are indicated as three axes, which are orthogonal to one another.

The specimen S is processed in advance before performing the measurement to acquire the SEM image series and the measurement to acquire the EDS mapping image series. In the processing performed in advance, the periphery of an observation target is cut by the FIB processing, as illustrated in FIG. 3, so that the first cross-section (cross-section at the $0^{th}$ slice) to image the SEM image and the EDS mapping image is exposed.

In the step of repeatedly exposing a cross-section of the specimen S, the specimen S is FIB-processed so that a cross-section is repeatedly exposed at an interval D in the Z direction. In other words, the interval D is a thickness of one slice in the FIB processing. By the FIB processing, a cross-section that is parallel with the XY plane is formed on the specimen S. The FIB processing is performed in the Z direction until the predetermined processing range in the Z direction ends.

The step of performing the measurement to acquire the SEM image will be described next. The measurement to acquire the SEM image is performed by: scanning a cross-section of the specimen S with the electron beam; the secondary electron detector 30 detecting secondary electrons emitted from the specimen S; and the SEM image generation unit 32 generating the SEM image based on the detection signals outputted from the secondary electron detector 30.

The measurement to acquire the SEM image is performed each time when a cross-section of the specimen S is exposed. In other words, the interval (measurement interval) set to perform the measurements to acquire the SEM image matches with the interval D. The interval of performing the measurements to acquire the SEM image refers to, for example, the distance between two cross-sections, when a measurement to acquire the SEM image of a cross-section and a measurement to acquire the SEM image of the next cross-section are performed. The SEM image series can be acquired by performing the measurement to acquire the SEM image each time when a cross-section of the specimen S is exposed.

The step of performing the measurement to acquire the EDS mapping image will be described next. The measurement to acquire the EDS mapping image is performed by: scanning a cross-section of the specimen S with the electron beam; the EDS detector 40 detecting the characteristic X-ray emitted from the specimen S; and the EDS mapping image generation unit 42 generating the EDS mapping image based on the detection signal outputted from the EDS detector 40.

The measurement to acquire the EDS mapping image is performed each time when a cross-section of the specimen S is exposed n times. In other words, the interval (measurement interval) of performing the measurements to acquire the EDS mapping image is n times that of the interval of performing measurements to acquire the SEM image. That is, the measurement interval of the EDS mapping image is n times that of the interval D.

3. Processing by Control Unit

The processing by the control unit 50 of the scanning electron microscope 100 will be described next. In the scanning electron microscope 100, the measurement to acquire the SEM image series and the measurement to acquire the EDS mapping image series are automatically performed when the measurement conditions to acquire the SEM image series and the measurement conditions to acquire the EDS mapping image are inputted via the operation unit 60.

First the measurement conditions to acquire the SEM image series and the measurement conditions to acquire the EDS mapping image series will be described.

Figure 4:
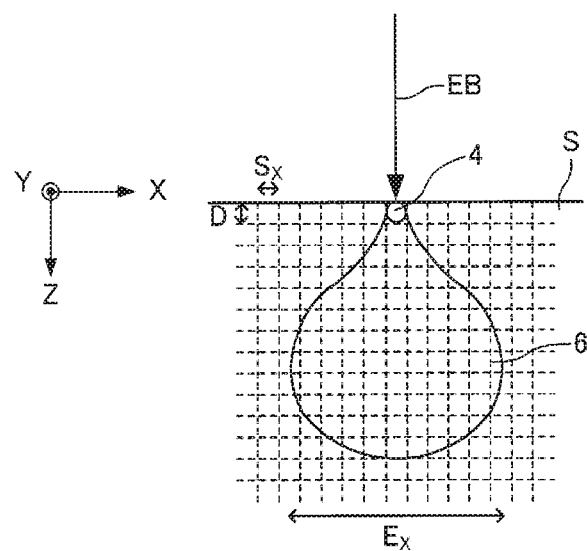
FIG. 4 is a schematic diagram illustrating a generation region of secondary electrons and a generation region of characteristic X-rays.

FIG. 4 is a schematic diagram illustrating a generation region 4 of the secondary electrons and a generation region 6 of the characteristic X-ray when the specimen S is irradiated with the electron beam EB.

As illustrated in FIG. 4, the generation region and the generation amount of the secondary electrons are significantly different from those of the characteristic X-ray. Therefore, the measurement time required for acquiring an image having the highest resolution and sufficient signal-to-noise ratio (SN ratio) is considerably different between the measurement to acquire the SEM image and the measurement to acquire the EDS mapping image. In concrete terms, in the case of the measurement to acquire the SEM image, the spatial resolution is about 1 nm, and the measurement time to acquire one SEM image is several seconds to several tens of seconds. In the case of the measurement to acquire the EDS mapping image, on the other hand, the spatial resolution is several hundreds nm to 1 μm, and the measurement time to acquire one EDS mapping image is several minutes to several tens of minutes. The measurement conditions to acquire the SEM image series and the measurement conditions to acquire the EDS mapping image series are determined considering the difference of the spatial resolution and the difference of the measurement time.

The measurement conditions to acquire the SEM image series include, for example, an imaging region of the SEM image, a number of pixels of the SEM image, and a measurement interval of the SEM image.

The imaging region of the SEM image is a region in which the SEM image is captured, and is determined by the size of the measurement target.

The width of the SEM image is, for example, about 1280 pixels to 5120 pixels. The image quality improves as a number of pixels increases. However, the measurement time increases as a number of pixels increases if the staying time of the electron beam in each pixel is the same. Therefore, a number of pixels is determined considering a trade-off between the required image quality and measurement time.

A number of pixels of the SEM image may be set to any number, but it is preferable that the size of one pixel is not too small with respect to the maximum resolution of the measurement. For example, when the width of the imaging region is 10 μm, and the width of the SEM image is 1280 pixels, the length of one pixel in the X direction is about 8 nm. When the width of the SEM image is 5120 pixels, the length of one pixel in the X direction is about 2 nm.

By determining the imaging region of the SEM image and a number of pixels of the SEM image, the length of one pixel of the SEM image in the X direction and the length of that in the Y direction, that is, the length of one voxel of the three-dimensional reconstructed image in the X direction and the length of that in the Y direction are determined.

The measurement interval of the SEM image is determined in accordance with the spatial resolution of the measurement to acquire the SEM image, for example. The measurement interval of the SEM image matches with the interval D. The measurement interval of the SEM image corresponds to the length in the Z direction of one voxel of the three-dimensional reconstructed image acquired by using the SEM image series. It is ideal if the length in the X direction, the length in the Y direction and the length in the Z direction of one voxel of the three-dimensional reconstructed image are the same.

The measurement conditions to acquire the EDS mapping image series include, for example, an imaging region of the EDS mapping image, a number of pixels of the EDS mapping image, and a measurement interval of the EDS mapping.

The imaging region of the EDS mapping image is a region in which the EDS mapping image is captured, and is determined by the size of the measurement target in the specimen S. In the case of acquiring both the SEM image series and the EDS mapping image series, it is preferable to match the imaging region of the SEM image and the imaging region of the EDS mapping image.

A number of pixels of the EDS mapping image is set to be less than that of the SEM image. This is because, as mentioned above, the spatial resolution of the measurement to acquire the EDS mapping image is lower than that of the measurement to acquire the SEM image. The width of the EDS mapping image is about 128 to 512 pixels, for example. In other words, a number of pixels in the width of the EDS mapping image is about 1/10 of a number of pixels in the width of the SEM image.

A number of pixels of the EDS mapping image may be set to any number, but this number is determined such that the size of one pixel is not too small with respect to the maximum resolution of the measurement. For example, when the width of the imaging region is 10 μm, the length of one pixel in the X direction is about 80 nm if the width of the EDS mapping image is 128 pixels. The length of one pixel in the X direction is about 20 nm if the width of the EDS mapping image is 512 pixels. As mentioned above, the length of one pixel of the EDS mapping image in the X direction is about 10 times that of the length of one pixel of the SEM image in the X direction.

By determining the imaging region of the EDS mapping image and a number of pixels of the EDS mapping image, the length of one pixel of the EDS mapping image in the X direction and the length of that in the Y direction, that is, the length of one voxel of the three-dimensional reconstructed image in the X direction and the length of that in the Y direction are determined.

The measurement interval of the EDS mapping image is determined in accordance with the spatial resolution of the measurement to acquire the EDS mapping image. The measurement interval of the EDS mapping image corresponds to the length in the Z direction of one voxel of the three-dimensional reconstructed image acquired by using the EDS mapping image series. The measurement interval of the EDS mapping image is set to n times (n is an integer of 2 or more) of the measurement interval of the SEM image. In other words, the measurement to acquire the SEM image is performed each time when a cross-section of the specimen S is exposed, while the measurement to acquire the EDS mapping image is performed each time when a cross-section of the specimen S is exposed n times.

As mentioned above, it is ideal if the length in the X direction, the length in the Y direction and the length in the Z direction of one voxel of the three-dimensional reconstructed image are the same. Therefore, the measurement interval of the EDS mapping image is set to be longer than the measurement interval of the SEM image. Also as mentioned above, the length of one pixel of the EDS mapping image in the X direction (that is, the length of one voxel in the X direction) is about 10 times the length of one pixel of the SEM image in the X direction. Hence the measurement interval of the EDS mapping image is determined to be about 10 times the measurement interval of the SEM image. In other words, the measurement to acquire the SEM image is performed each time when a cross-section of the specimen S is exposed, while the measurement to acquire the EDS mapping image is performed each time when a cross-section of the specimen S is exposed 10 times.

Figure 5:
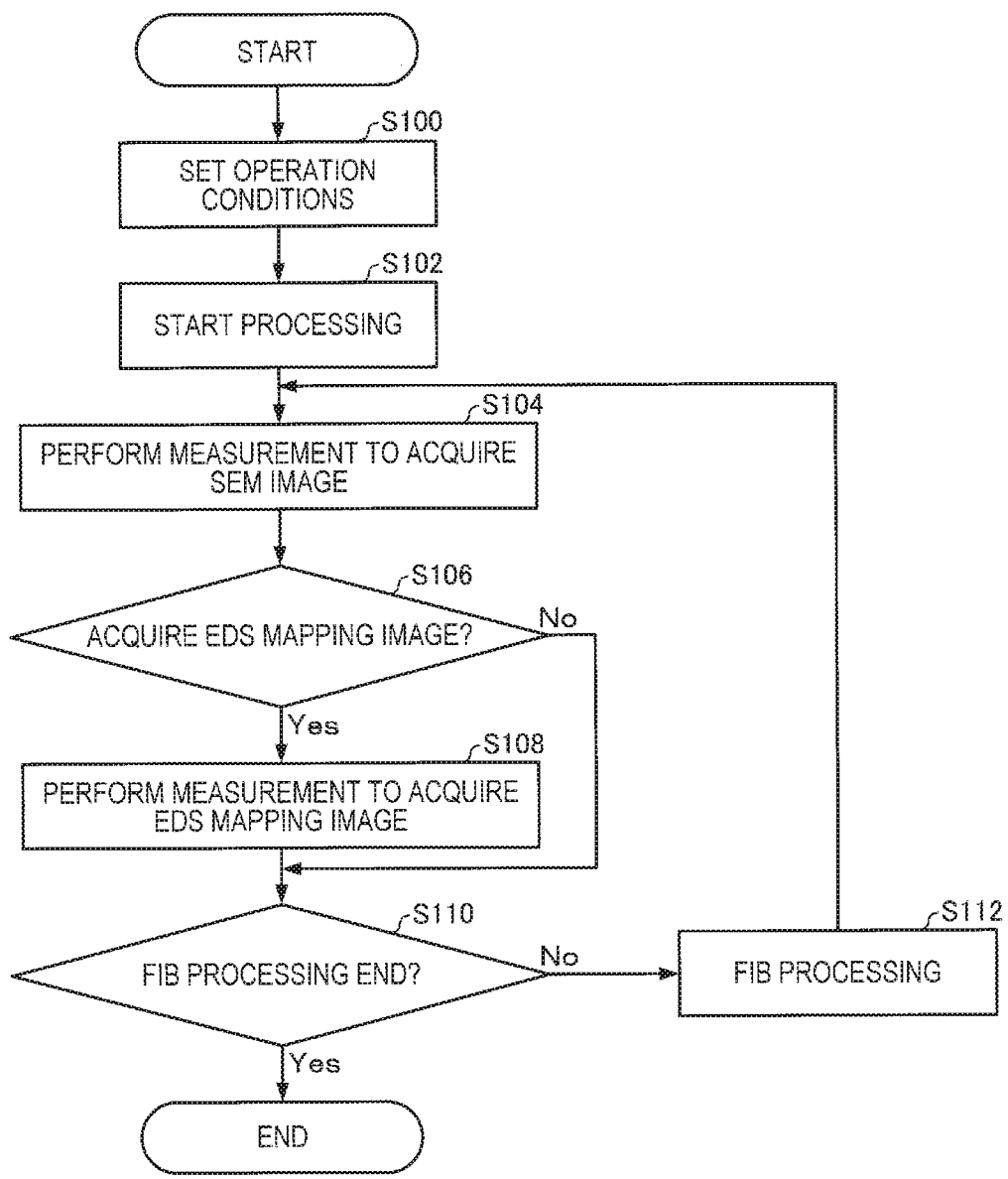
FIG. 5 is a flow chart illustrating an example of processing of a control unit of the scanning electron microscope.

FIG. 5 is a flow chart illustrating an example of the processing by the control unit 50 of the scanning electron microscope 100.

When the measurement conditions to acquire the SEM image series and the measurement conditions to acquire the EDS mapping image series are inputted via the operation unit 60, the control unit 50 sets the operations of the FIB column 20, the SEM column 10, the secondary electron detector 30, the SEM image generation unit 32, the EDS detector 40, and the EDS mapping image generation unit 42 based on the inputted measurement conditions (S100).

In concrete terms, the interval D is set based on the inputted measurement interval of the SEM image. Further, the range to perform FIB processing in the Z direction is set based on the inputted measurement range of the SEM image. And the range to perform the FIB processing in the Z direction is determined by the product of the interval D and the number of times of slicing, hence the range may be specified by the number of times of slicing.

Based on the inputted measurement interval of the SEM image, the measurement interval of the SEM image, that is, a timing of the acquiring the SEM image, is set. Further, based on the inputted imaging range and a number of pixels of the SEM image, the scanning conditions of the electron beam in the measurement to acquire the SEM image are set. The scanning conditions of the electron beam includes the scanning pitch and the scanning speed.

Based on the inputted measurement interval of the EDS mapping image, the measurement interval of the EDS mapping image, that is, a timing of acquiring the EDS mapping image, is set. In concrete terms, the above-mentioned value of "n" is set. Further, based on the inputted imaging region and a number of pixels of the EDS mapping image, the scanning conditions of the electron beam in the measurement to acquire the EDS mapping image, are set.

When the operation conditions are set, the control unit 50 starts the processing to acquire the SEM image series and the EDS mapping image series (S102).

The control unit 50 controls the SEM column 10, so that a cross-section of the specimen S is scanned by the electron beam based on the predetermined scanning conditions of the electron beam in the measurement to acquire the SEM image, and acquires the SEM image generated by the SEM image generation unit 32 (S104). The acquired SEM image is stored in the storage unit 64.

Then the control unit 50 determines whether the measurement to acquire the EDS mapping image is performed on a currently exposed cross-section (in this case, the cross-section on the 0$^{th}$ slice) of the specimen S based on the predetermined measurement interval of the EDS mapping image (S106).

If it is set that the measurement is performed each time when a cross-section of the specimen S is exposed 10 times, that is, if n=10, then it is determined that the measurement to acquire the EDS mapping image is performed on a cross-section acquired in the preliminary processing (cross-section on the 0$^{th}$ slice), a cross-section on the 10$^{th}$ slice, a cross-section on the 20$^{th}$ slice, etc.

If it is determined that EDS mapping is performed (Yes in S106), the control unit 50 controls the SEM column 10 so that a cross-section of the specimen S is scanned by the electron beam based on the predetermined scanning condition of the electron beam in the measurement to acquire the EDS mapping image, and acquires the EDS mapping image generated by the EDS mapping image generation unit 42 (S108). The acquired EDS mapping image is stored in the storage unit 64.

After acquiring the EDS mapping image (after S108) or if it is determined that the EDS mapping is not performed (No in S106), the control unit 50 determines whether the FIB processing is terminated based on the predetermined range of performing the FIB processing in the Z direction (S110).

If it is determined that the FIB processing is not terminated (No in S110), the control unit 50 controls the FIB column 20 so that the FIB processing, to expose a new cross-section, is performed (S112). The control unit 50 controls the FIB column 20 based on the predetermined interval D. Thereby the specimen S is processed, and a new cross-section is formed.

Then returning to step S104, the control unit 50 performs the processing to acquire the SEM image for a new cross-section formed in step S112. The control unit 50 repeatedly performs the processing in steps S104, S106, S108, S110 and S112 until it is determined that the FIB processing is terminated (Yes in S110). As a result, the SEM image series and the EDS mapping image series are stored in the storage unit 64.

When it is determined that the FIB processing is terminated (Yes in S110), the control unit 50 terminates the processing.

The control unit 50 generates three-dimensional reconstructed images respectively from the SEM image series and the EDS mapping image series stored in the storage unit 64. Then the three-dimensional reconstructed image acquired by using the SEM image series and the three-dimensional reconstructed image acquired by using the EDS mapping image series are displayed on the display unit 62.

Figure 6:
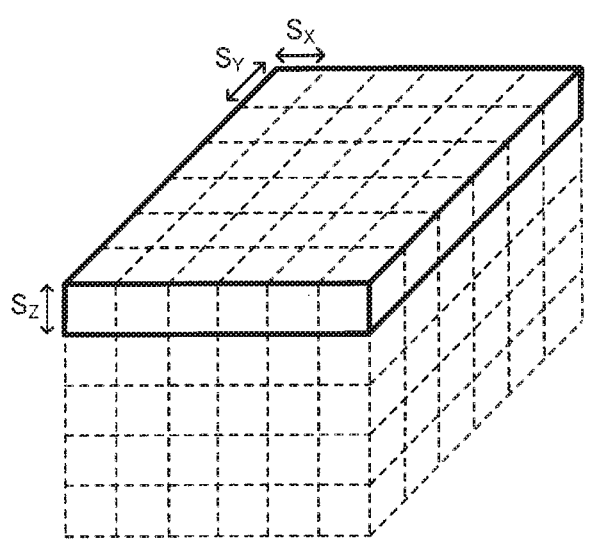
FIG. 6 is a schematic diagram illustrating a three-dimensional reconstructed image acquired by using an SEM image series.

FIG. 6 is a schematic diagram illustrating a three-dimensional reconstructed image acquired by using the SEM image series.

The length $S_x$ in the X direction of one voxel of the three-dimensional reconstructed image in FIG. 6 corresponds to the scanning pitch of the electron beam in the X direction in the measurement to acquire the SEM image, and the length $S_y$ in the Y direction of one voxel corresponds to the scanning pitch of the electron beam in the Y direction. And the length $S_z$ in the Z direction of one voxel of the three-dimensional reconstructed image acquired by using the SEM image series corresponds to the measurement interval of the SEM image, that is, the interval D. In FIG. 6, the length $S_x$ of one voxel in the X direction, the length $S_y$ of one voxel in the Y direction, and the length $S_z$ of one voxel in the Z direction are the same, and an ideal three-dimensional reconstructed image is acquired.

Figure 7:
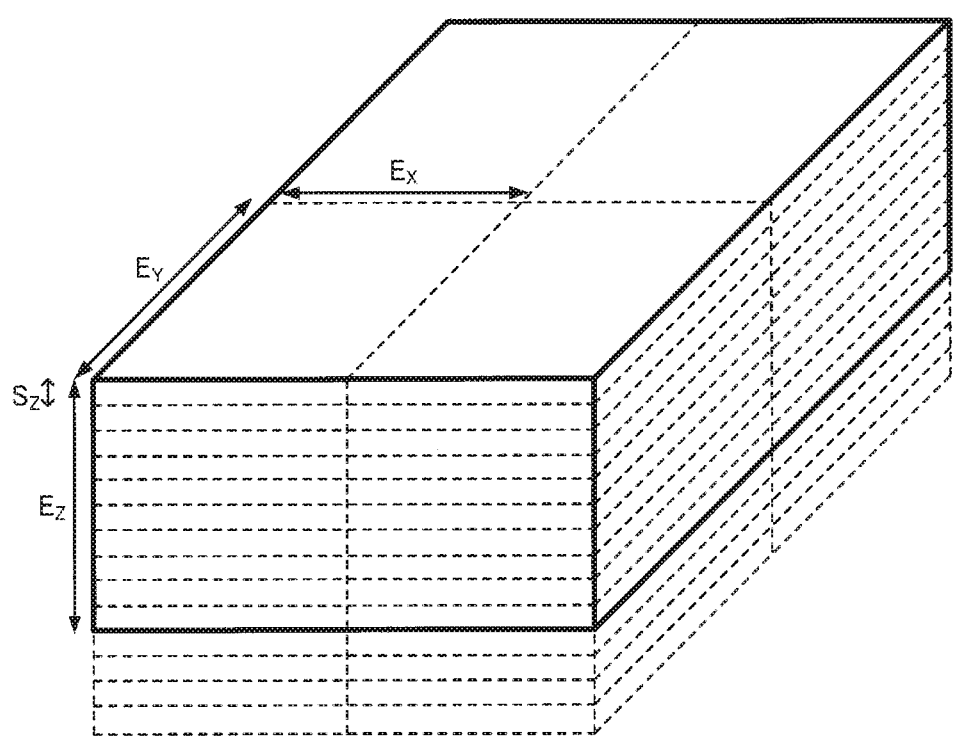
FIG. 7 is a schematic diagram illustrating a three-dimensional reconstructed image acquired by using an EDS mapping image series.

FIG. 7 is a schematic diagram illustrating a three-dimensional reconstructed image acquired by using the EDS mapping image series.

The length $E_x$ in the X direction of one voxel of the three-dimensional reconstructed image in FIG. 7 corresponds to the scanning pitch of the electron beam in the X direction in the measurement to acquire the EDS mapping image, and the length $E_y$ in the Y direction of one voxel corresponds to the scanning pitch of the electron beam in the Y direction. The length $E_z$ in the Z direction of one voxel of the three-dimensional reconstructed image acquired by using the EDS mapping image series corresponds to the measurement interval of the EDS mapping image, that is, n times that of the interval D. In FIG. 7, the length $E_x$ of one voxel in the X direction, the length $E_y$ of one voxel in the Y direction, and the length $E_z$ of one voxel in the Z direction are the same, and an ideal three-dimensional reconstructed image is acquired.

In this way, by using the scanning electron microscope 100, the SEM image series and the EDS mapping image series, to construct an ideal three-dimensional reconstructed image, can be acquired in a short period of time.

For example, in the case when a thickness of each slice (that is, interval D) in the FIB processing is set in accordance with the measurement interval of the measurement to acquire the SEM image, if the measurement to acquire the EDS mapping image is performed each time when a cross-section of the specimen S is exposed, data sampling in the Z direction is performed in the EDS mapping image series to excess.

In the scanning electron microscope 100, on the other hand, the measurement to acquire the EDS mapping image is performed each time when a cross-section of the specimen S is exposed n times (n is an integer of 2 or more), hence the measurement time can be reduced compared with the case of performing the measurement to acquire the EDS mapping image each time when a cross-section is exposed.

Here the measurement to acquire the EDS mapping image takes a longer period of time compared with the measurement to acquire the SEM image, and performing the measurement to acquire the EDS mapping image to excess increases a ratio of wasteful time to the total measurement time. In the case of performing the measurement which takes time like this, the scanning electron microscope 100 is especially effective.

The scanning electron microscope 100 has the following features, for example.

In the scanning electron microscope 100, the control unit 50 performs: processing to control the FIB column 20 so that a cross-section of the specimen S is repeatedly exposed at an interval D; processing to perform a measurement to acquire the SEM image by irradiating a cross-section of the specimen S with an electron beam each time when a cross-section of the specimen S is exposed; and processing to perform a measurement to acquire the EDS mapping image by irradiating a cross-section of the specimen S with an electron beam each time when a cross-section of the specimen S is exposed n times (n is an integer of 2 or more). Therefore, in the scanning electron microscope 100, in using the scanning electron microscope, the measurement to acquire the SEM image series and the EDS mapping image series can be performed in a short period of time.

The scanning electron microscope 100 includes the operation unit 60, which is an input unit which receives input of an interval of performing the measurement to acquire the SEM image, and input of an interval of performing the measurement to acquire the EDS mapping image, and the control unit 50 sets the thickness of each slice (that is, the interval D) in the FIB processing based on the inputted interval of performing the measurement to acquire the SEM image, and sets "n" based on the inputted interval of performing the measurement to acquire the EDS mapping image. Therefore, in the scanning electron microscope 100, the interval of performing the measurement to acquire the SEM image and the interval of performing the measurement to acquire the EDS mapping image can be set separately.

The measurement method according to an embodiment of the invention has the following characteristics, for example.

The measurement method according to an embodiment of the invention includes: a step of repeatedly exposing a cross-section of a specimen S at an interval D; a step of performing a measurement to acquire the SEM image by irradiating a cross-section of the specimen S with an electron beam each time when a cross-section of the specimen S is exposed; and a step of performing a measurement to acquire the EDS mapping image by irradiating a cross-section of the specimen S with an electron beam each time when a cross-section of the specimen S is exposed n times (n is an integer of 2 or more). Therefore, in the measurement method according to the embodiment of the invention, the measurement to acquire the SEM image series and the EDS mapping image series can be performed in a short period of time.

4. Modifications

The invention is not limited to the above-mentioned embodiments, but various modifications are possible within the scope of the invention.

4.1 First Modification

Initially a first modification will be described. In the above-mentioned embodiments, the interval D and "n" are set by the user inputting the interval used to perform the measurement to acquire the SEM image, and the interval used to perform the measurement to acquire the EDS mapping image, via the operation unit 60.

In this modification, however, the control unit 50 calculates the interval D based on the size (area) of the imaging region of the SEM image and a number of pixels of the SEM image, and calculates "n" from the size (area) of the imaging region of the EDS mapping image and a number of pixels of the EDS mapping image.

In concrete terms, the control unit 50 determines the length of one pixel in the X direction based on the size of the imaging region of the SEM image and a number of pixels of the SEM image, and regards the calculated length of one pixel in the X direction as the interval D. Thereby the length of one voxel of the three-dimensional reconstructed image becomes the same in the X direction, the Y direction and the Z direction.

Further, the control unit 50 determines the length of one pixel in the X direction based on the size of the imaging region of the EDS mapping image and a number of pixels of the EDS mapping image. Then "n" is determined comparing the length of one pixel in the X direction of the EDS mapping image with the length of one pixel in the X direction of the SEM image.

In this way, according to the first modification, the control unit 50 sets the interval D based on the size of the imaging region of the SEM image and a number of pixels of the SEM image, and sets "n" based on the size of the imaging region of the EDS mapping image and a number of pixels of the EDS mapping image. Therefore, the interval D and the "n" to acquire an ideal three-dimensional reconstructed image can be easily set.

The control unit 50 may calculate the size of the secondary electron generation region from the material of the specimen S and the irradiation conditions (e.g. accelerating voltage, illumination current, beam diameter) of the electron beam, estimate the spatial resolution based on this calculation result, and set the scanning pitch in the X direction, the scanning pitch in the Y direction, and the interval D in the measurement to acquire the SEM image. In the same way, the control unit 50 may calculate the size of the characteristic X-ray generation region from the material of the specimen S and the irradiation conditions (e.g. accelerating voltage, illumination current, beam diameter) of the electron beam, estimate the spatial resolution based on this calculation result, and set the scanning pitch in the X direction, the scanning pitch in the Y direction, and the "n" in the measurement to acquire the EDS mapping image.

4.2 Second Modification

Figure 8:
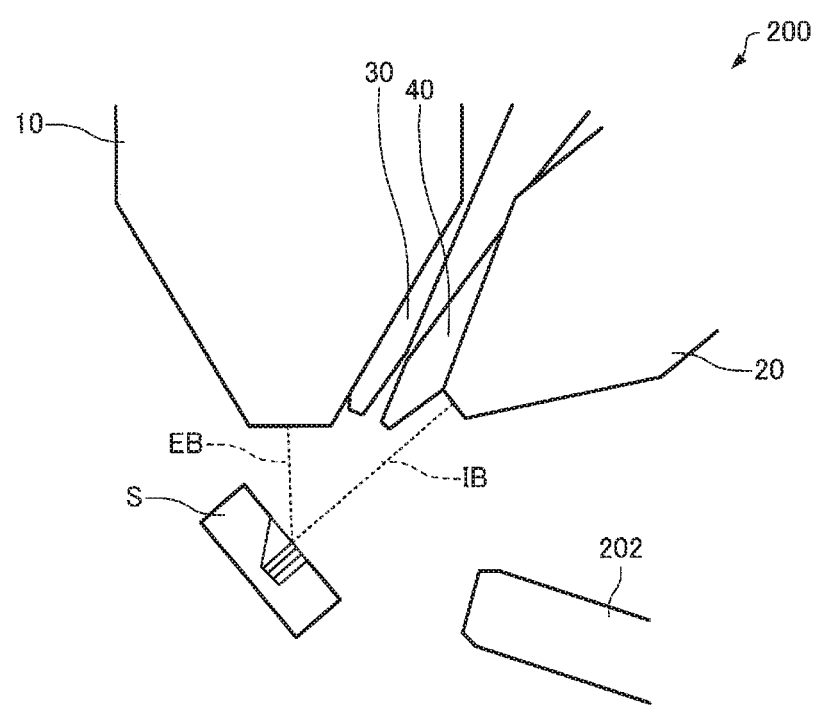
FIG. 8 is a schematic diagram illustrating a scanning electron microscope according to the second modification.

A second modification will be described next. FIG. 8 is a schematic diagram illustrating a scanning electron microscope 200 according to the second modification. In the scanning electron microscope 200 according to the second modification, a composing member having the same function as that of the above-mentioned scanning electron microscope 100 is denoted with the same reference number, for which detailed description will be omitted.

The above-mentioned scanning electron microscope 100 includes the secondary electron detector 30 and the EDS detector 40, as illustrated in FIG. 2, and acquires the SEM image series and the EDS mapping image series.

The scanning electron microscope 200, on the other hand, includes the secondary electron detector 30 and an electron back scatter diffraction pattern (EBSD) detector 202, as illustrated in FIG. 8, and acquires the SEM image series and the EBSD mapping image series.

The EBSD method will be described first. When an electron beam enters the specimen S in a direction of about 70° from the surface of the specimen S, the electrons are diffracted and emitted from the specimen S as reflected electrons. The diffraction pattern that appears at this time is projected to the EBSD detector 202, and a crystal orientation is analyzed based on the acquired diffracted pattern. Further, the EBSD mapping image is acquired by scanning the specimen S with the electron beam and acquiring the EBSD pattern thereby. In the EBSD mapping image, the orientation of the crystal grains, the crystal grain boundaries, the difference of crystals phases and the like can be visualized.

The spatial resolution of the measurement to acquire the EBSD mapping image is lower than the spatial resolution of the measurement to acquire the SEM image. Therefore, the processing to acquire the EBSD mapping image series is performed in the same way as the processing to acquire the EDS mapping image.

In other words, the control unit 50 performs: processing to control the FIB column 20 so that a cross-section of the specimen S is repeatedly exposed at an interval D; processing to perform measurement to acquire the SEM image by irradiating a cross-section of the specimen S with the electron beam each time when a cross-section of the specimen S is exposed; and processing to perform measurement to acquire the EBSD mapping image by irradiating a cross-section of the specimen S with the electron beam each time when a cross-section of the specimen S is exposed n times (n is an integer of 2 or more). Thereby the scanning electron microscope 200 can reduce the measurement time, just like the above-mentioned scanning electron microscope 100.

In the above-mentioned scanning electron microscope 100, the measurement to acquire the SEM image and the measurement to acquire the EDS mapping image are performed, and in the scanning electron microscope 200, the measurement to acquire the SEM image and the measurement to acquire the EBSD mapping image are performed, however in the scanning electron microscope according to an embodiment of the invention, a combination of measurements to acquire images is not limited to the above-mentioned combinations.

For example, a measurement to acquire the SEM image and a measurement to acquire a mapping image using a soft X-ray may be combined, or a measurement to acquire the SEM image and a measurement to acquire a mapping image using cathodoluminescence may be combined. The spatial resolution of the measurement to acquire the mapping image using a soft X-ray and that of the measurement to acquire the mapping image using cathodoluminescence are both lower than the spatial resolution of the measurement to acquire the SEM image. Therefore, these measurements can be performed in the same way as the measurement to acquire the EDS mapping image.

The above-described embodiments and modifications are examples and the invention is not limited thereto. For example, the embodiments and the modifications may be combined appropriately.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:

1. A scanning electron microscope comprising:
   an ion beam column that irradiates a specimen with an ion beam;
   an electron beam column that irradiates the specimen with an electron beam;
   a first detector that detects a first signal from the specimen;
   a first image generation unit that generates a first image based on a detection signal from the first detector;
   a second detector that detects a second signal from the specimen;
   a second image generation unit that generates a second image based on a detection signal from the second detector; and
   a control unit that controls the ion beam column and the electron beam column,
   the control unit performing:
      processing to control the ion beam column to cause the specimen to be repeatedly sliced to a predetermined thickness by an ion beam;
      processing to perform a first measurement to acquire the first image based on the detection signal from the first detector by irradiating a cross-section of the specimen with the electron beam each time when the specimen is sliced by the ion beam;
      processing to perform a second measurement to acquire the second image based on the detection signal from the second detector by irradiating the cross-section of the specimen with the electron beam each time only when the specimen is sliced n times, wherein n is an integer of 2 or more;
      wherein a spatial resolution of the first measurement is higher than a spatial resolution of the second measurement; and wherein measurement conditions of the second measurement to acquire the second image are determined based on:
a difference of the spatial resolution of the first measurement and the spatial resolution of the second measurement; and
a difference of a measurement time of the first measurement and a measurement time of the second measurement.

2. The scanning electron microscope according to claim 1, further comprising:
an input unit that receives input of an interval of performing the first measurement and input of an interval of performing the second measurement,
wherein the control unit sets the predetermined thickness based on the interval of performing the first measurement, and sets the n based on the interval of performing the second measurement.

3. The scanning electron microscope according to claim 1, wherein
the control unit sets the predetermined thickness based on a size of an imaging region of the first image and a number of pixels of the first image, and
the control unit sets the n based on a size of an imaging region of the second image and a number of pixels of the second image.

4. The scanning electron microscope according to claim 1, wherein
in the first measurement, a scanning electron microscope image is acquired by detecting electrons emitted from the specimen, and
in the second measurement, an energy dispersive X-ray spectrometry (EDS) mapping image is acquired by detecting X-rays emitted from the specimen.

5. The scanning electron microscope according to claim 1, wherein
in the first measurement, a scanning electron microscope image is acquired by detecting electrons emitted from the specimen, and
in the second measurement, an electron back scatter diffraction pattern (EBSD) mapping image is acquired by detecting reflected electrons reflected from the specimen.

6. A measurement method comprising:
slicing a specimen repeatedly to a predetermined thickness;
performing a first measurement to acquire a first image based on a detection signal from a first detector by irradiating a cross-section of the specimen with an electron beam each time when the specimen is sliced; and
performing a second measurement to acquire a second image based on a detection signal from a second detector by irradiating the cross-section of the specimen with the electron beam each time only when the specimen is sliced n times, wherein n is an integer of 2 or more,
wherein a spatial resolution of the first measurement is higher than a spatial resolution of the second measurement; and
wherein measurement conditions of the second measurement to acquire the second image are determined based on:
a difference of the spatial resolution of the first measurement and the spatial resolution of the second measurement; and
a difference of a measurement time of the first measurement and a measurement time of the second measurement.

7. The measurement method according to claim 6, further comprising:
setting the predetermined thickness based on a size of an imaging region of the first image and a number of pixels of the first image; and
setting the n based on a size of an imaging region of the second image and a number of pixels of the second image.

8. The measurement method according to claim 6, wherein
in the first measurement, a scanning electron microscope image is acquired by detecting electrons emitted from the specimen, and
in the second measurement, an energy dispersive X-ray spectrometry (EDS) mapping image is acquired by detecting X-rays emitted from the specimen.

9. The measurement method according to claim 6, wherein
in the first measurement, a scanning electron microscope image is acquired by detecting electrons emitted from the specimen, and
in the second measurement, an electron back scatter diffraction pattern (EBSD) mapping image is acquired by detecting reflected electrons reflected from the specimen.

* * * * *